US011127448B2

(12) United States Patent
Fujino

(10) Patent No.: US 11,127,448 B2
(45) Date of Patent: Sep. 21, 2021

(54) RESISTANCE CHANGE MEMORY DEVICE AND ASSOCIATED METHODS

(71) Applicant: KIOXIA CORPORATION, Tokyo (JP)

(72) Inventor: Yorinobu Fujino, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/817,039

(22) Filed: Mar. 12, 2020

(65) Prior Publication Data

US 2021/0082486 A1    Mar. 18, 2021

(30) Foreign Application Priority Data

Sep. 17, 2019   (JP) .............................. JP2019-168649

(51) Int. Cl.
*G11C 11/16*        (2006.01)
*G11C 16/04*        (2006.01)

(52) U.S. Cl.
CPC ...... *G11C 11/1675* (2013.01); *G11C 11/1673* (2013.01); *G11C 11/1677* (2013.01); *G11C 16/0425* (2013.01); *G11C 16/0433* (2013.01)

(58) Field of Classification Search
CPC ............ G11C 11/1675; G11C 16/0433; G11C 11/1677; G11C 11/1673; G11C 16/0425
See application file for complete search history.

(56) References Cited

U.S. PATENT DOCUMENTS

| 8,593,853 B2 | 11/2013 | Katoh |
| 9,263,115 B2 | 2/2016 | Kajigaya |
| 10,157,655 B2 | 12/2018 | Fujino et al. |
| 10,388,345 B2 | 8/2019 | Hatsuda et al. |
| 10,431,277 B2 | 10/2019 | Hatsuda et al. |
| 2006/0092734 A1 | 5/2006 | Tsuchida et al. |
| 2009/0129141 A1 | 5/2009 | Hosotani et al. |
| 2012/0069633 A1 | 3/2012 | Katoh et al. |
| 2015/0063020 A1 | 3/2015 | Kajigaya |
| 2020/0321041 A1* | 10/2020 | Antonyan ........... G11C 11/1655 |

FOREIGN PATENT DOCUMENTS

| JP | 2006127672 A | 5/2006 | |
| JP | 2011023046 A | 2/2011 | |
| JP | 5307213 B2 | 7/2013 | |
| TW | 200939221 A | 9/2009 | |
| WO | WO-2014190046 A1 * | 11/2014 | ............... G11C 7/14 |
| WO | WO-2018167962 A1 * | 9/2018 | ....... H03K 19/17736 |

* cited by examiner

*Primary Examiner* — Ajay Ojha
(74) *Attorney, Agent, or Firm* — Holtz, Holtz & Volek PC

(57) ABSTRACT

According to one embodiment, a memory device includes a resistance change memory element to which one of a low-resistance state and a high-resistance state is allowed to be set in accordance with a write current, a first transistor including a first gate, and causing a current to flow through the resistance change memory element in a first write period, a voltage holding section holding a first voltage applied to the first gate in the first write period, and a second transistor including a second gate, in which the first voltage held in the voltage holding section is applied to the second gate, thereby causing a current to flow through the resistance change memory element in a second write period after the first write period.

16 Claims, 7 Drawing Sheets

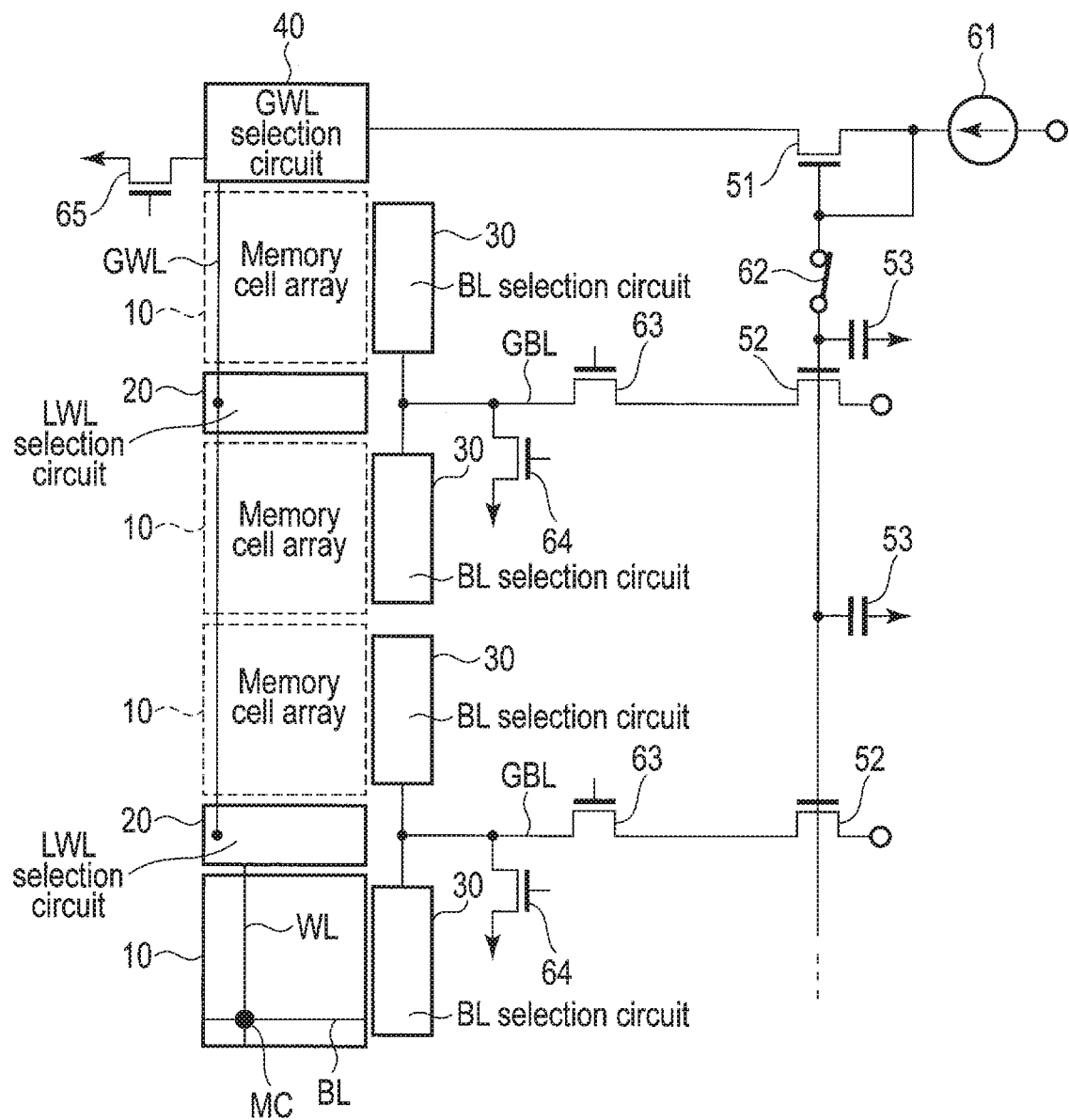
F I G. 1

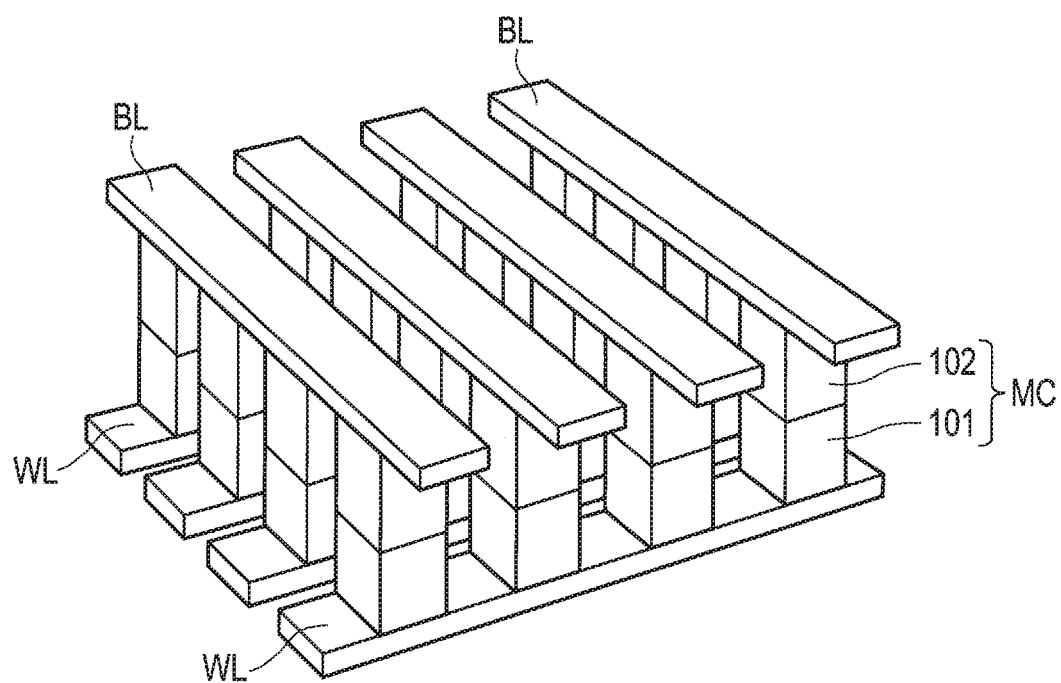
F I G. 2
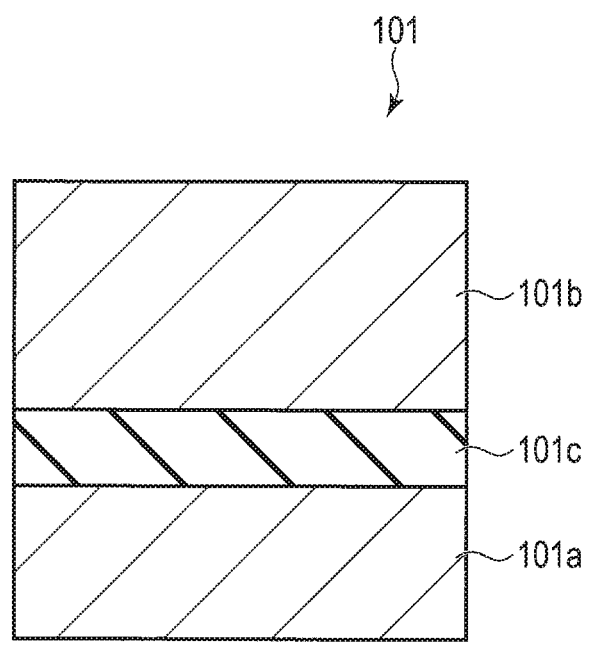
F I G. 3

US 11,127,448 B2

RESISTANCE CHANGE MEMORY DEVICE AND ASSOCIATED METHODS

CROSS-REFERENCE TO RELATED APPLICATIONS

This application is based upon and claims the benefit of priority from Japanese Patent Application No. 2019-168649, filed Sep. 17, 2019, the entire contents of which are incorporated herein by reference.

FIELD

Embodiments described herein relate generally to a memory device.

BACKGROUND

A memory device in which a resistance change memory element such as a magnetoresistive element is integrated on a semiconductor substrate has been proposed.

BRIEF DESCRIPTION OF THE DRAWINGS

FIG. 1 is schematic diagram showing a configuration of a memory device according to a first embodiment.

FIG. 2 is a schematic bird's eye view showing a basic configuration of a memory cell array area in the memory device according to the first embodiment.

FIG. 3 is a schematic cross-sectional view showing an exemplary configuration of a magnetoresistive element (resistance change memory element) included in a memory cell in the memory device according to the first embodiment.

DETAILED DESCRIPTION

Figure 4:
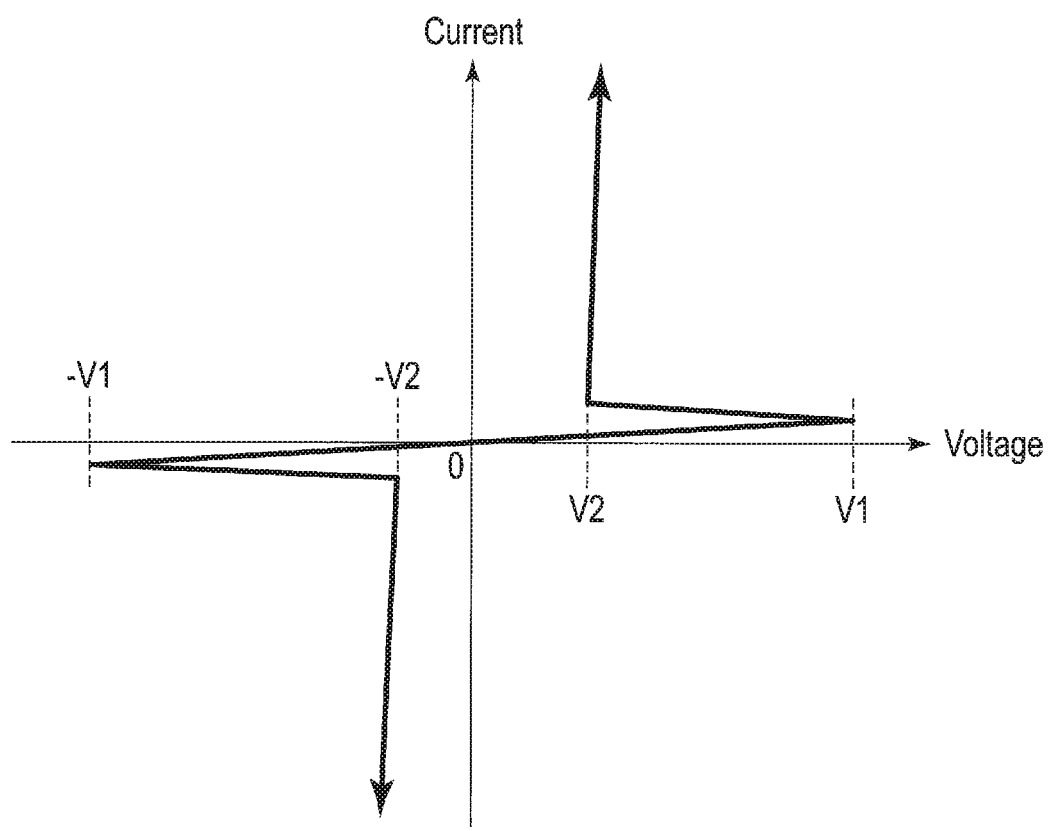
FIG. 4 is a schematic diagram showing current-voltage characteristics of a selector (switching element) included in a memory cell in the memory device according to the first embodiment.

In general, according to one embodiment, a memory device includes: a first resistance change memory element to which one of a first low-resistance state and a first high-resistance state is allowed to be set in accordance with a write current; a first transistor including a first gate, a first source and a first drain and causing a current to flow through the first resistance change memory element in a first write period; a voltage holding section holding a first voltage applied to the first gate in the first write period; and a second transistor including a second gate, a second source and a second drain, in which the first voltage held in the voltage holding section is applied to the second gate, thereby causing a current to flow through the first resistance change memory element in a second write period after the first write period.

Embodiments will be described below with reference to the accompanying drawings.

First Embodiment

FIG. 1 is schematic diagram showing a configuration of a memory device, namely, a semiconductor integrated circuit device according to a first embodiment.

The memory device shown in FIG. 1 includes a memory cell array area 10, a local word line (LWL) selection circuit 20, a bit line (BL) selection circuit 30, a global word line (GWL) selection circuit 40, a first transistor 51, a second transistor 52 and a voltage holding section 53.

FIG. 2 is a schematic bird's eye view showing a basic configuration of the memory cell array area 10.

As shown in FIG. 2, the memory cell array area 10 includes a plurality of memory cells MC, a plurality of word lines WL and a plurality of bit lines BL. Each of the memory cells MC is connected between its corresponding word line WL and its corresponding bit line BL. Applying a predetermined voltage between a word line WL connected to a target memory cell MC and a bit line BL connected to the target memory cell MC to cause a predetermined current to flow makes it possible to write data to the target memory cell MC and read data therefrom. Each of the memory cells MC includes a magnetoresistive element (resistance change memory element) 101 and a selector (switching element) 102 connected in series to the magnetoresistive element (resistance change memory element) 101.

In the example shown in FIG. 2, the bit lines BL are provided on the upper-layer side of the word lines WL, but they may be provided on the lower-layer side of the word lines WL. In the example shown in FIG. 2, the selector 102 is provided on the upper-layer side of the magnetoresistive element 101, but it may be provided on the lower-layer side of the magnetoresistive element 101.

Returning to FIG. 1, the LWL selection circuit 20 selects a word line WL connected to a target memory cell MC, and the BL selection circuit 30 selects a bit line BL connected to a target memory cell MC. When a voltage is applied between the selected word line WL and the selected bit line BL to cause a predetermined current to flow, data is written to the target memory cell MC and data is read therefrom, as described above.

The GWL selection circuit 40 selects a target one from among a plurality of LWL selection circuits 20.

FIG. 3 is a schematic cross-sectional view showing an exemplary configuration of the magnetoresistive element (resistance change memory element) included in a memory cell MC. Note that the magnetoresistive element is also referred to as a magnetic tunnel junction (MTJ) element.

As shown in FIG. 3, the magnetoresistive element 101 includes a storage layer (first magnetic layer) 101a, a reference layer (second magnetic layer) 101b, and a tunnel barrier layer (nonmagnetic layer)) 101c provided between the storage layer 101a and the reference layer 101b.

The storage layer 101a is formed of a ferromagnetic layer having a variable magnetization direction. The reference layer 101b is formed of a ferromagnetic layer having a fixed magnetization direction. The tunnel barrier layer 101c is a nonmagnetic layer formed of an insulating material. Note that the variable magnetization direction means that the magnetization direction changes with a predetermined write current and the fixed magnetization direction means that the magnetization direction does not change with a predetermined write current.

When the magnetization direction of the storage layer 101a is parallel to that of the reference layer 101b, the magnetoresistive element 101 is brought into a low-resistance state. When the magnetization direction of the storage layer 101a is antiparallel to that of the reference layer 101b, the magnetoresistive element 101 is brought into a high-resistance state. The magnetoresistive element 101 can thus store binary data in accordance with the resistance state (low-resistance state and high-resistance state). The resistance state (low-resistance state and high-resistance state) of the magnetoresistive element 101 can be set in accordance with the direction of a write current that flows through the magnetoresistive element 101. In other words, the resistance state is set to vary between the case where current flows from the storage layer 101a toward the reference layer 101b and the case where current flows from the reference layer 101b toward the storage layer 101a.

The example shown in FIG. 3 is directed to a bottom-free magnetoresistive element in which the storage layer 101a is located on the lower-layer side than the reference layer 101b, but a top-free magnetoresistive element in which the storage layer 101a is located on the upper-layer side than the reference layer 101b may be used. The magnetoresistive element may further include a shift canceling layer to cancel a magnetic field to be applied to the storage layer 101a from the reference layer 101b.

FIG. 4 is a schematic diagram showing current-voltage characteristics of the selector (switching element) 102 included in a memory cell MC. As the selector 102, for example, a two-terminal switching element having a switching function may be used.

If a voltage to be applied between two terminals is less than a threshold value, the switching element is in a "high-resistance" state, e.g., in an electrically non-conductive state. If a voltage to be applied between two terminals is equal to or greater than a threshold value, the switching element is in a "low-resistance" state, e.g., in an electrically conductive state.

As shown in FIG. 4, the selector 102 has bidirectional (positive and negative directions), mutually symmetric current-voltage characteristics. For example, in the current-voltage characteristic in the positive direction, when a voltage between two terminals of the selector 102 increases and reaches a predetermined voltage V1, the selector 102 is turned on, the voltage between the two terminals shifts to V2, and the current increases sharply. The same holds true for the current-voltage characteristics in the negative direction. Note that the selector 102 may not necessarily have symmetric current-voltage characteristics.

Applying a voltage between a word line WL and a bit line BL to turn on the selector 102 makes it possible to write data to the magnetoresistive element (resistance change memory element) 101 and read data therefrom.

Returning to FIG. 1, the first transistor 51 is an NMOS transistor whose gate and drain are diode-connected, and functions as a current-voltage conversion transistor (I-V conversion transistor). A constant-current source 61 is connected to the first transistor 51 to cause a constant current to flow through the first transistor 51. More specifically, during a first write period, the current supplied from the constant-current source 61 to the first transistor 51 is supplied to a selected memory cell MC through the GWL selection circuit 40, global word line GWL, LWL selection circuit 20 and word line WL. During the first write period, therefore, a common current flows through the first transistor 51 and the magnetoresistive element 101 and selector 102 in the selected memory cell MC.

The voltage holding section 53 holds a first voltage applied to the gate of the first transistor 51 during the first write period. As described above, a constant current flows between the drain and source of the first transistor 51 during the first write period. At this time, a switch 62 is closed, and the voltage holding section 53 holds the first voltage applied to the gate of the first transistor 51.

The voltage holding section 53 is configured by a capacitor provided at a wiring (gate-to-gate wiring) between the gate of the first transistor 51 and that of the second transistor 52. That is, as the capacitor of the voltage holding section 53, a capacitor element can be provided between the gate-to-gate wiring and the ground, and parasitic capacitance of the gate-to-gate wiring can be used. The gate capacitance of the transistor may also be used together with them.

The second transistor 52 is an NMOS transistor and functions as a clamp transistor in which the first voltage held in the voltage holding section 53 is applied to the gate and the voltage of the source is clamped based on the voltage applied to the gate during a second write period after the first write period. Specifically, during the second write period, the current supplied to the second transistor 52 is supplied to a selected memory cell MC through the transistor 63, global bit line GBL, BL selection circuit 30 and bit line BL. That is, during the second write period, a common current flows through the second transistor 52 and the magnetoresistive element 101 and selector 102 in the selected memory cell MC.

Figure 5:
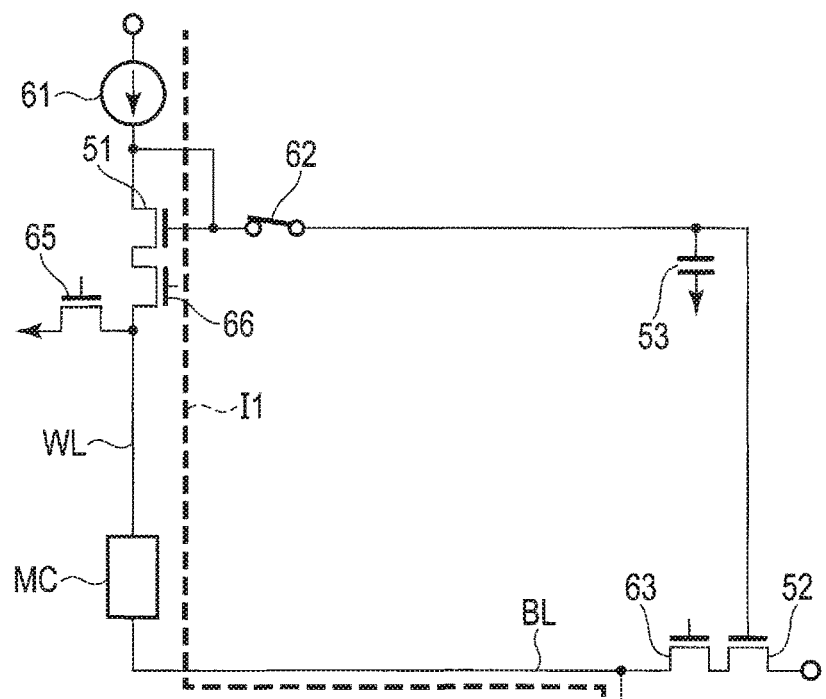
FIG. 5 is a diagram showing a write operation during a first write period of the memory device according to the first embodiment.

FIG. 5 is a diagram showing details of a write operation during the first write period.

During the first write period, the switch 62 is in an on state, the transistor 63 is in an off state, a transistor 64 is in an on state, a transistor 65 is in an off state and a transistor 66 is in an on state. Accordingly, current I1 is supplied from the constant current source 61 to the magnetoresistive element in a selected memory cell MC through the first transistor 51, transistor 66 and word line WL and then flows to the ground through the bit line BL and the transistor 64. In addition, the voltage applied to the gate of the first transistor 51 is held in the voltage holding section 53.

During the first write period, the magnetoresistive element in the memory cell MC is maintained in a low resistance state. Specifically, before the first write period, data is written in advance such that the magnetoresistive element is brought into a low-resistance state. During the first write period, the direction of the current I1 flowing through the first transistor 51 and the magnetoresistive element coincides with that of current flowing through the magnetoresistive element when the magnetoresistive element is set in a low-resistance state. During the first write period, the magnitude of the current I1 flowing through the first transistor 51 and the magnetoresistive element corresponds to that of current which should flow through the magnetoresistive element when the magnetoresistive element is set in a high-resistance state. The magnitude of the current I1 flowing through the magnetoresistive element is equal to that of the current which should flow through the magnetoresistive element when the magnetoresistive element is set in a high-resistance state, but the direction of flow of the current I1 coincides with that of the current flowing through the magnetoresistive element when the magnetoresistive element is set in a low-resistance state. During the first write period, therefore, the magnetoresistive element is maintained in a low-resistance state.

Figure 6:
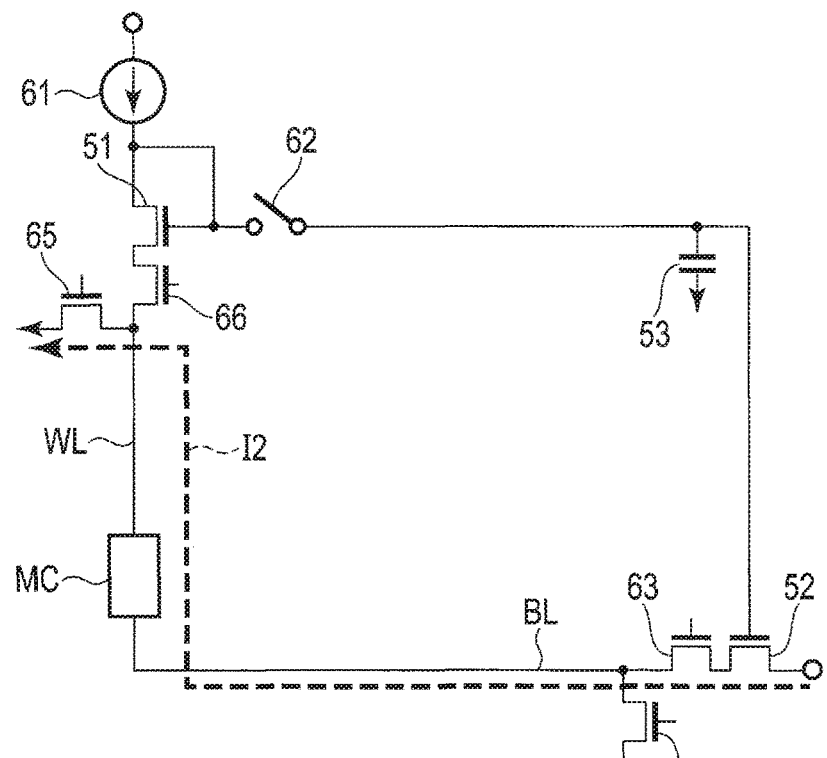
FIG. 6 is a diagram showing a write operation during a second write period of the memory device according to the first embodiment.

FIG. 6 is a diagram showing details of a write operation during the second write period.

During the second write period, the switch 62 is in an off state, the transistor 63 is in an on state, the transistor 64 is in an off state, the transistor 65 is in an on state and the transistor 66 is in an off state. The voltage held in the voltage holding section 53 is applied to the gate of the second transistor 52. Accordingly, current I2 is supplied from a predetermined power supply to the magnetoresistive element in a selected memory cell MC through the second transistor 52, transistor 63 and bit line BL and then flows to the ground through the word line WL and the transistor 65.

As described above, during the second write period, the voltage held in the voltage holding section 53 is applied to the gate of the second transistor 52. The level of the voltage held in the voltage holding section 53 is the same as that of the voltage applied to the gate of the first transistor 51 during the first write period. In addition, the first and second transistors 51 and 52 have the same current-voltage characteristics, and the selector connected in series to the magnetoresistive element has a bidirectionally symmetrical current-voltage characteristics. In the initial stage of the second write period, the magnetoresistive element in the memory cell MC is maintained in a low-resistance state as during the first write period. In the initial stage of the second write period, therefore, the magnitude of the current I2 flowing through the second transistor 52 and the magnetoresistive element is equal to that of the current I1 flowing through the first transistor 51 and the magnetoresistive element during the first write period. However, the direction of the current I1 flowing through the first transistor 51 and the magnetoresistive element during the first write period is opposite to that of the current I2 flowing through the second transistor 52 and the magnetoresistive element during the second write period. As has been described, the magnitude of the current I1 flowing through the magnetoresistive element during the first write period is equal to that of current which should flow through the magnetoresistive element when the magnetoresistive element is set in a high-resistance state. The direction of the current I2 flowing through the magnetoresistive element during the second write period coincides with that of current flowing through the magnetoresistive element when the magnetoresistive element is set in a high-resistance state. During the second write period, therefore, the magnetoresistive element shifts from the low-resistance state to the high-resistance state.

As can be seen from the above description, during the second write period, the source voltage of the second transistor 52, which is clamped by the second transistor 52, is applied to a memory cell MC, and the magnetoresistive element is set in a high-resistance state. After the magnetoresistive element is set in the high-resistance state during the second write period, the current flowing through the second transistor 52 and the magnetoresistive element decreases, and the source voltage clamped by the second transistor 52 is maintained. Since, furthermore, the selector connected in series to the magnetoresistive element is in an on state, an almost constant voltage is applied to the selector. Therefore, even after the magnetoresistive element shifts from the low-resistance state to the high-resistance state, the voltage applied to the magnetoresistive element is maintained at a constant value without increasing.

As described above, in the first embodiment, the voltage applied to the gate of the first transistor 51 during the first write period is held in the voltage holding section 53, and the voltage held in the voltage holding section 53 is applied to the gate of the second transistor 52 during the second write period. Performing the write operation as described above makes it possible to perform a constant-voltage write to the magnetoresistive element (resistance change memory element) during the second write period. When a constant-current write is performed instead of the constant-voltage write, a high voltage is applied to the magnetoresistive element when the magnetoresistive element shifts from the low-resistance state to the high-resistance state, which may adversely affect the reliability of the magnetoresistive element and the like. In the first embodiment, the above constant-voltage write makes it possible to reduce adverse effects on the magnetoresistive element when a write operation is performed to set the magnetoresistive element in the high-resistance state and to perform an appropriate write to the magnetoresistive element.

Since, furthermore, the foregoing constant-voltage write can be performed using the first and second transistors 51 and 52 in the first embodiment, a large-scale circuit such as an operational amplifier need not be used. A constant-voltage write can thus be performed by a small circuit scale. Accordingly, for example, a write circuit can be placed to correspond to the memory cell array area 10. As shown in FIG. 1, for example, the second transistor 52 can be placed to correspond to the memory cell array area 10. It is therefore possible to suppress IR drop, RC delay and the like in a write pass and thus perform a reliable write operation at high speed.

Second Embodiment

Next is a description of a second embodiment. Note that the basic matters of the second embodiment are similar to those of the foregoing first embodiment and thus their descriptions will be omitted.

Figure 7:
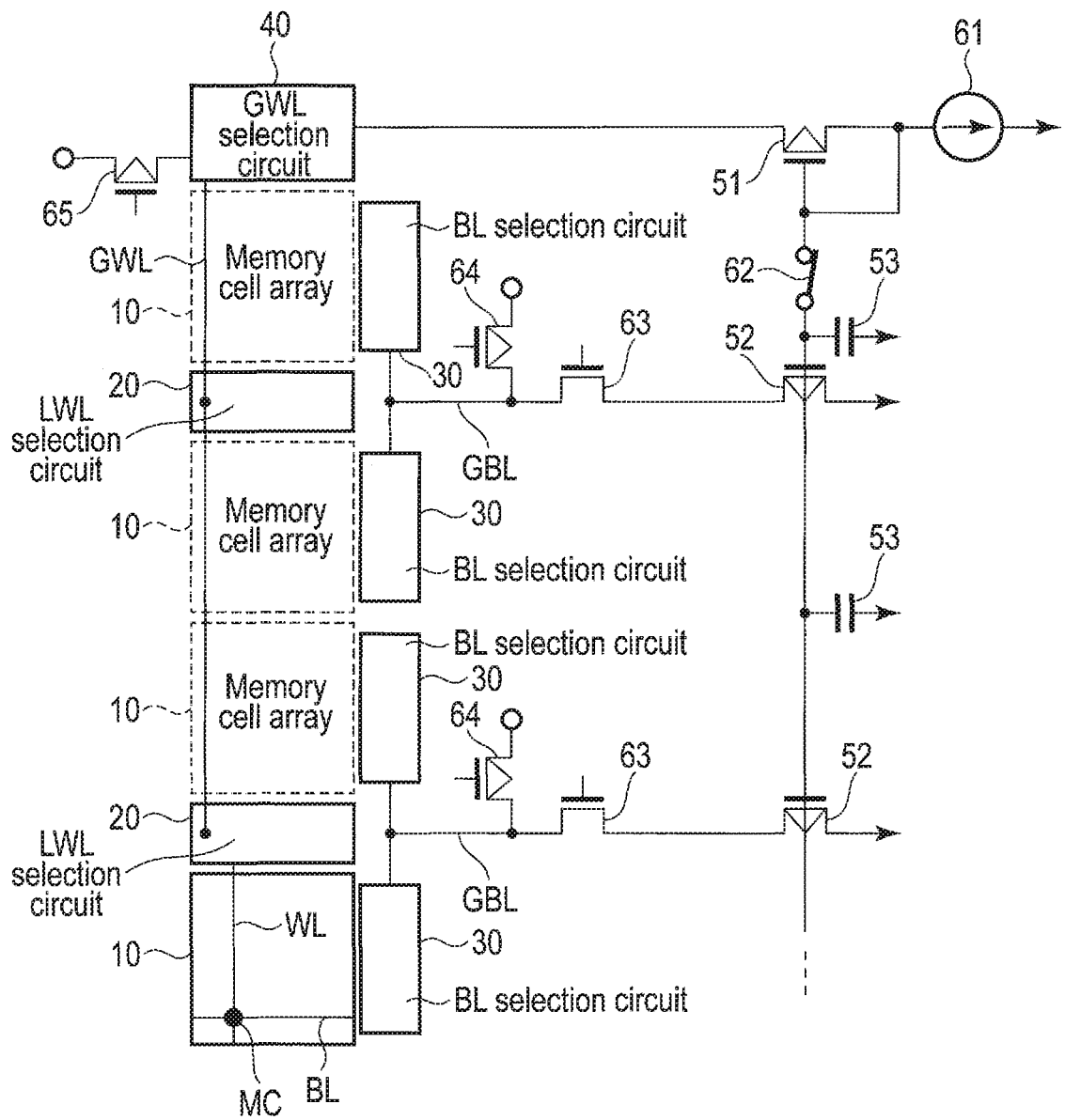
FIG. 7 is schematic diagram showing a configuration of a memory device according to a second embodiment.

FIG. 7 is schematic diagram showing a configuration of a memory device (semiconductor integrated circuit device) according to the second embodiment. Note that components like those shown in FIG. 1 are denoted by like reference numerals and reference symbols.

In the foregoing first embodiment, an NMOS transistor is used for each of the first and second transistors 51 and 52. In the second embodiment, however, a PMOS transistor is used for each of the first and second transistors 51 and 52. Thus, the write direction of the second embodiment is opposite to that of the first embodiment during both the first and second write periods.

Specifically, in the second embodiment, the current supplied to the magnetoresistive element (resistance change memory element) flows through the first transistor 51 during the first write period, and the current supplied to the magnetoresistive element flows through the second transistor 52 during the second write period. The other basic operations are similar to those of the first embodiment and thus their descriptions will be omitted.

As described above, the basic configuration and basic operation of the second embodiment are similar to those of the first embodiment, and advantageous effects similar to those of the first embodiment can be obtained from the second embodiment.

Third Embodiment

Next is a description of a third embodiment. Note that the basic matters of the third embodiment are similar to those of the foregoing first embodiment and thus their descriptions will be omitted.

Figure 8:
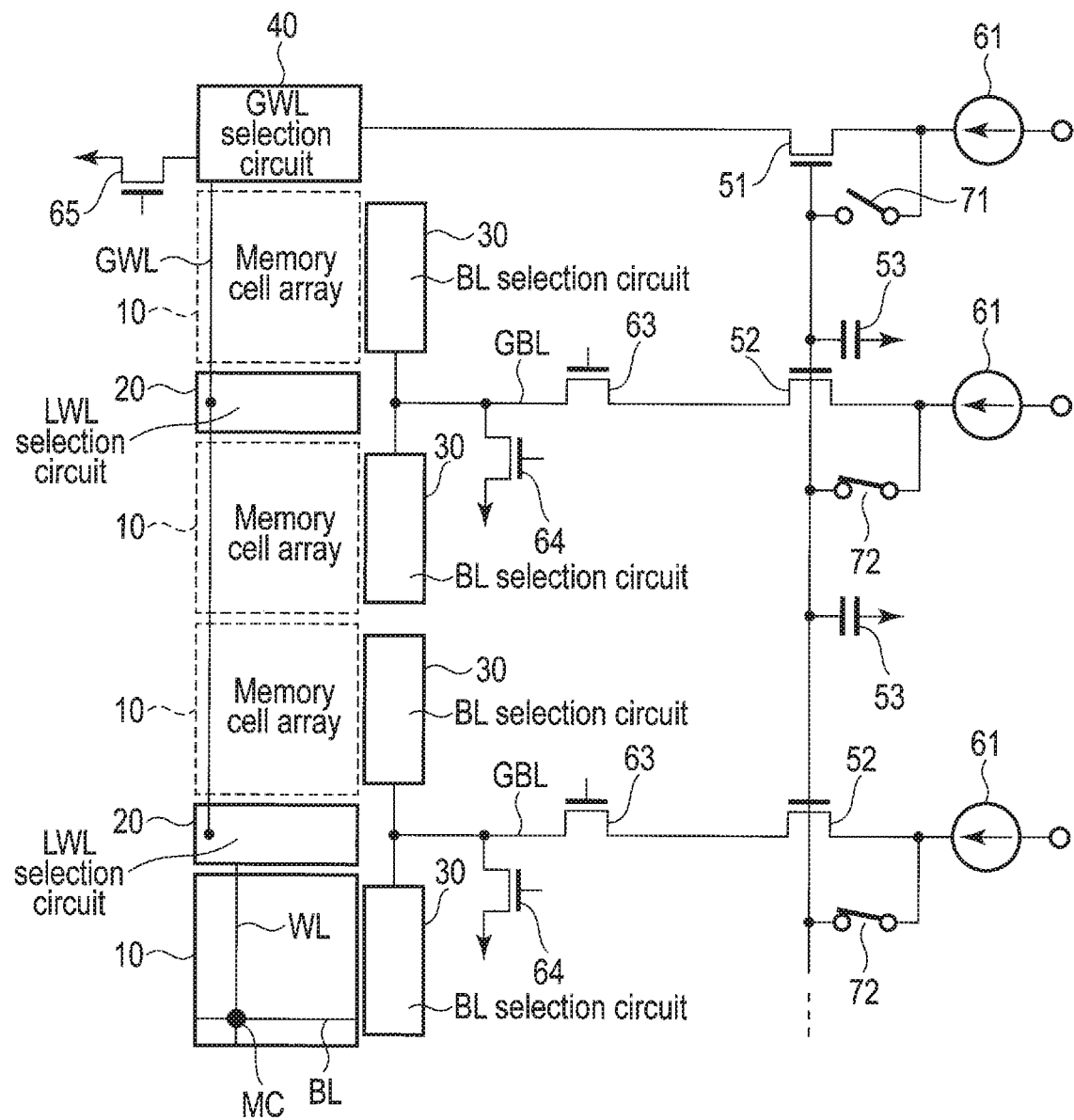
FIG. 8 is schematic diagram showing a configuration of a memory device according to a third embodiment.

FIG. 8 is schematic diagram showing a configuration of a memory device (semiconductor integrated circuit device) according to the third embodiment. Note that components like those shown in FIG. 1 are denoted by like reference numerals and reference symbols.

In the third embodiment, a first switch 71 is provided between the gate (first gate) and drain (first drain) of the first transistor 51, and a second switch 72 is provided between the gate (second gate) and drain (second drain) of the second transistor 52. With this configuration, each of the first and second transistors 51 and 52 can have different functions.

Figure 9:
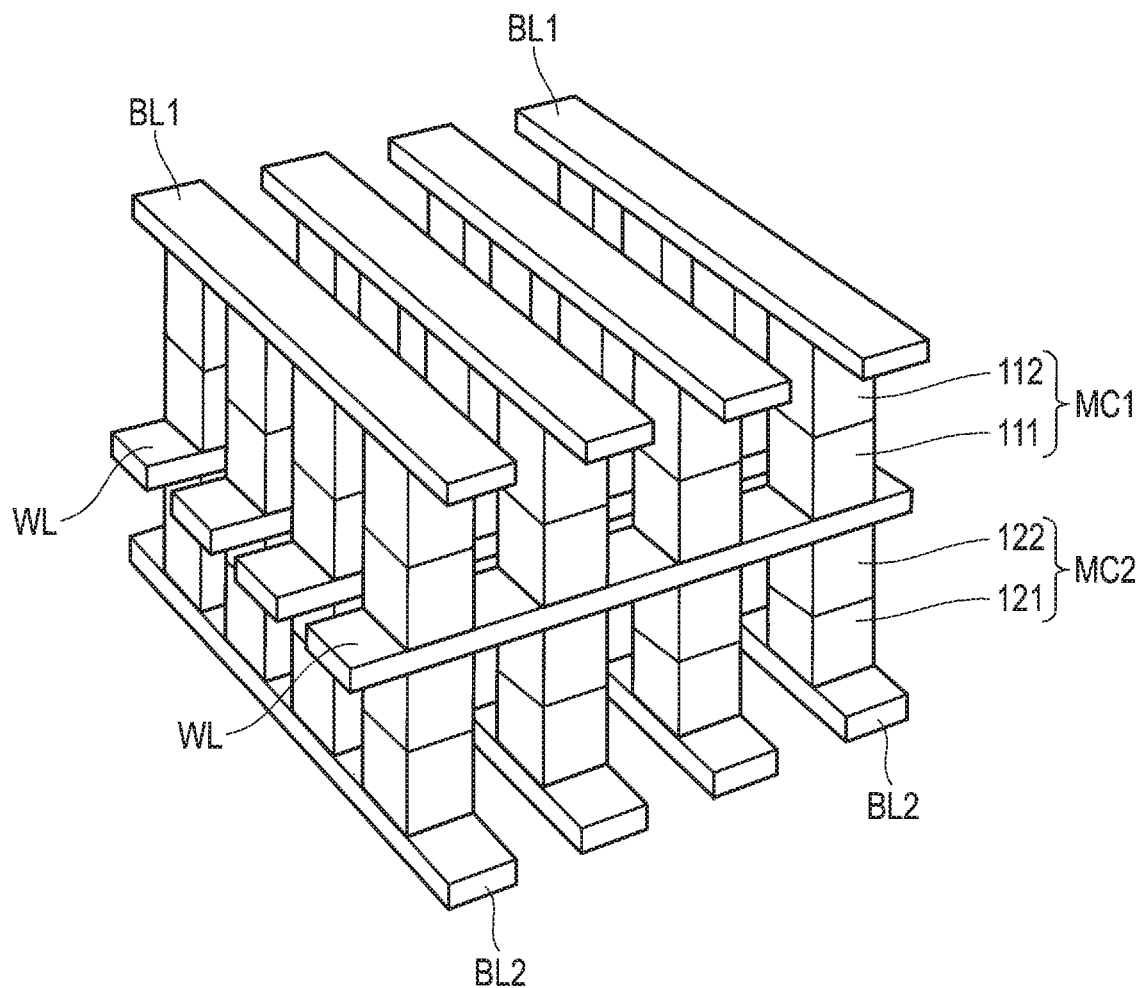
FIG. 9 is a schematic bird's eye view showing a basic configuration of a memory cell array area in the memory device according to the third embodiment.

FIG. 9 is a schematic bird's eye view showing a basic configuration of the memory cell array area 10 of the third embodiment.

As shown in FIG. 9, in the third embodiment, two memory cells MC1 and MC2 are provided at corresponding positions in the memory cell array area 10. Specifically, a first memory cell MC1 is provided between a word line WL and a first bit line BL, and a second memory cell MC2 is provided between the word line WL and a second bit line BL2. The basic configuration of each of the memory cells MC1 and MC2 is similar to that of the memory cell MC of the first embodiment. The first memory cell MC1 includes a first magnetoresistive element (first resistance change memory element) 111 and a first selector (first switching element) 112, and the second memory cell MC2 includes a second magnetoresistive element (second resistance change memory element) 121 and a second selector (second switching element) 122. The basic configuration of each of the magnetoresistive elements (resistance change memory elements) 111 and 121 is similar to that of the magnetoresistive element (resistance change memory element) 101 of the first embodiment, and the basic configuration of each of the selectors (switching elements) 112 and 122 is also similar to that of the selector (switching element) 102 of the first embodiment 1.

As shown in FIG. 9, in the third embodiment, the first bit line BL1 is provided on the upper-layer side of a word line WL and the second bit line BL2 is provided on the lower-layer side of the word line WL. The order in which the storage layer, tunnel barrier layer and reference layer are stacked one on another in the first magnetoresistive element 111 is the same as the order in which the storage layer, tunnel barrier layer and reference layer are stacked one on another in the second magnetoresistive element 121. It is thus necessary to make the current direction of a write circuit in the first magnetoresistive element 111 and that of the write circuit in the second magnetoresistive element 121 opposite to each other. In the third embodiment, therefore, the first and second switches 71 and 72 are provided to perform the following operations.

In the third embodiment, the switch 71 is closed and the switch 72 is open during the first and second write periods. That is, the first transistor (NMOS transistor) 51 functions as a current-voltage conversion transistor (I-V conversion transistor) with a diode connection, and the second transistor 52 (NMOS transistor) functions as a clamp transistor. Thus, an operation similar to that of the first embodiment described above is performed during the first and second write periods. As a result, data is written to the magnetoresistive element in the selected memory cell MC. Specifically, data is written to the first magnetoresistive element 111 in the first memory cell MC1.

In the third embodiment, the switch 71 is open and the switch 72 is closed during a third write period and a fourth write period after the third write period. Therefore, unlike during the first and second write periods, the second transistor 52 functions as a current-voltage conversion transistor with a diode connection, and the first transistor 51 functions as a clamp transistor.

Below is a specific description of an operation to be performed during the third and fourth write periods.

During the third write period, a current common to the current supplied from the constant current source 61 to the second transistor 52 flows through the second magnetoresistive element 121 and second selector 122 in a selected memory cell MC2. More specifically, the current supplied from the constant current source 61 to the second transistor 52 is supplied to the second magnetoresistive element 121 in the selected second memory cell MC2 through the transistor 63, global bit line GBL, BL selection circuit 30 and bit line BL. The current supplied to the second magnetoresistive element 121 flows to the ground through the word line WL, LWL selection circuit 20, global word line GWL, GWL selection circuit 40 and transistor 65. As a result, data is written to the second magnetoresistive element 121 in the second memory cell MC2. In addition, the voltage applied to the gate of the second transistor 52 is held in the voltage holding section 53.

The basic write principle in the third write period is similar to that in the first write period described in the first embodiment. That is, write is performed in advance such that the second magnetoresistive element 121 is brought into a low-resistance state before the third write period. During the third write period, the direction of current flowing through the second transistor 52 and the second magnetoresistive element 121 coincides with that of current flowing through the second magnetoresistive element 121 when the second magnetoresistive element 121 is set in a low-resistance state. Also, during the third write period, the magnitude of current flowing through the second transistor 52 and the second magnetoresistive element 121 corresponds to that of current which should flow through the second magnetoresistive element 121 when the second magnetoresistive element 121 is set in a high-resistance state. During the third write period, therefore, the second magnetoresistive element 121 is maintained in a low-resistance state.

During the fourth write period, the voltage held in the voltage holding section 53 is applied to the gate of the first transistor 51. Accordingly, a current common to the current supplied from the constant current source 61 to the first transistor 51 flows through the second magnetoresistive element 121 and second selector 122 in the selected second memory cell MC2. More specifically, the current supplied from the constant current source 61 to the first transistor 51 is supplied to the second magnetoresistive element 121 in the selected second memory cell MC2 through the GWL selection circuit 40, global word line GWL, LWL selection circuit 20 and word line WL. The current supplied to the second magnetoresistive element 121 flows to the ground through the bit line BL, BL selection circuit 30, global bit line GBL and transistor 64. As a result, data is written to the second magnetoresistive element 121 in the selected second memory cell MC2.

The basic write principle in the fourth write period is similar to that in the second write period described in the first embodiment. That is, in the initial stage of the fourth write period, the second magnetoresistive element 121 is maintained in a low-resistance state, and the magnitude of current flowing through the first transistor 51 and the second magnetoresistive element 121 is equal to that of current flowing through the second transistor 52 and the second magnetoresistive element 121 during the third write period. However, the direction of current flowing through the second transistor 52 and the second magnetoresistive element 121 during the third write period is opposite to that of current flowing through the first transistor 51 and the second magnetoresistive element 121 during the fourth write period. During the fourth write period, therefore, the second magnetoresistive element 121 shifts from the low-resistance state to the high-resistance state.

During the fourth write period, the source voltage clamped by the first transistor 51 is applied to the second memory cell MC2 in the same manner as described in the first embodiment, and the voltage applied to the second magnetoresistive element 121 is maintained at a constant value without increasing even after the second magnetoresistive element 121 shifts from the low-resistance state to the high-resistance state.

As described above, the basic configuration and basic operation of the third embodiment are similar to those of the first embodiment, and advantageous effects similar to those of the first embodiment can be obtained from the third embodiment.

Furthermore, in the third embodiment, the first and second switches 71 and 72 make it possible to cause the first and second transistors 51 and 52 to have different functions. Two memory cells MC are therefore connected to a common word line WL and, in other words, even when two magnetoresistive elements (resistance change memory elements) 111 and 121 are connected to a common word line WL, appropriate write can be performed.

In the first, second and third embodiments, a magnetoresistive element in which different resistance states (low-resistance and high-resistance states) are set according to a direction in which a write current flows is used as a resistance change memory element, but a resistance change memory element in which different resistance states (low-resistance and high-resistance states) are set in the same write direction can also be used. For example, a phase change memory (PCM) element can be used as a resistance change memory element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first resistance change memory element to which one of a first low-resistance state and a first high-resistance state is allowed to be set in accordance with a write current;
a first transistor including a first gate, a first source and a first drain and causing a current to flow through the first resistance change memory element in a first write period;
a voltage holding section holding a first voltage applied to the first gate in the first write period; and
a second transistor including a second gate, a second source and a second drain, in which the first voltage held in the voltage holding section is applied to the second gate, thereby causing a current to flow through the first resistance change memory element in a second write period after the first write period,
wherein the voltage holding section includes a capacitor provided at a wiring between the first gate and the second gate.

2. The memory device of claim 1, wherein:
the first resistance change memory element is maintained in the first low-resistance state in the first write period;
a direction of current flowing through the first transistor and the first resistance change memory element in the first write period coincides with a direction of current flowing through the first resistance change memory element when the first resistance change memory element is set to the first low-resistance state; and
a magnitude of current flowing through the first transistor and the first resistance change memory element in the first write period corresponds to a magnitude of current which allows the first resistance change memory element to be set to the first high-resistance state.

3. The memory device of claim 1, wherein:
the first transistor functions as a current-voltage conversion transistor in which the first gate and the first drain are connected to each other in the first write period; and
the second transistor functions as a clamp transistor in which a voltage of the second source is clamped based on a voltage applied to the second gate in the second write period.

4. The memory device of claim 3, wherein:
a constant voltage based on the voltage of the second source clamped by the second transistor is applied to the first resistance change memory element and the first resistance change memory element is set to the first high-resistance state in the second write period.

5. The memory device of claim 1, wherein:
a direction of current flowing through the first transistor and the first resistance change memory element in the first write period and a direction of current flowing through the second transistor and the first resistance change memory element in the second write period are opposite to each other.

6. The memory device of claim 1, wherein:
the first transistor and the second transistor are both NMOS transistors;
the current flowing through the first transistor is supplied to the first resistance change memory element in the first write period; and
the current flowing through the second transistor is supplied to the first resistance change memory element in the second write period.

7. The memory device of claim 1, wherein:
the first transistor and the second transistor are both PMOS transistors;
the current supplied to the first resistance change memory element flows through the first transistor in the first write period; and
the current supplied to the first resistance change memory element flows through the second transistor in the second write period.

8. The memory device of claim 1, wherein:
the first resistance change memory element is a magnetoresistive element.

9. The memory device of claim 1, further comprising:
a first switching element which is connected in series to the first resistance change memory element and through which a current common to the current flowing through the first resistance change memory element flows.

10. The memory device of claim 1, further comprising:

a second resistance change memory element to which one of a second low-resistance state and a second high-resistance state is allowed to be set in accordance with a write current;

a first switch provided between the first gate and the first drain; and a second switch provided between the second gate and the second drain, wherein:

the first switch is closed and the second switch is open in the first and second write periods;

the first switch is open and the second switch is closed in a third write period, and a common current flows through the second transistor and the second resistance change memory element;

the voltage holding section holds a second voltage applied to the second gate in the third write period; and the first switch is open and the second switch is closed in a fourth write period after the third write period, the second voltage held in the voltage holding section is applied to the first gate, and a common current flows through the first transistor and the second resistance change memory element.

11. The memory device of claim 10, wherein:

the second resistance change memory element is maintained in the second low-resistance state in the third write period; and a direction of current flowing through the second transistor and the second resistance change memory element in the third write period coincides with a direction of current flowing through the second resistance change memory element when the second resistance change memory element is set to the second low-resistance state;

a magnitude of current flowing through the second transistor and the second resistance change memory element in the third write period corresponds to a magnitude of current which allows the second resistance change memory element to be set to the second high-resistance state.

12. The memory device of claim 10, wherein:

the second transistor functions as a current-voltage conversion transistor in which the second gate and the second drain are connected to each other in the third write period; and the first transistor functions as a clamp transistor in which a voltage of the first source is clamped based on a voltage applied to the first gate in the fourth write period.

13. The memory device of claim 12, wherein:

a constant voltage based on the voltage of the first source clamped by the first transistor is applied to the second resistance change memory element and the second resistance change memory element is set to the second high-resistance state in the fourth write period.

14. The memory device of claim 10, wherein:

a direction of current flowing through the second transistor and the second resistance change memory element in the third write period and a direction of current flowing through the first transistor and the second resistance change memory element in the fourth write period are opposite to each other.

15. The memory device of claim 10, wherein:

the second resistance change memory element is a magnetoresistive element.

16. The memory device of claim 10, further comprising:

a second switching element which is connected in series to the second resistance change memory element and through which a current common to the current flowing through the second resistance change memory element flows.

* * * * *